US012685197B2

(12) United States Patent
Cyr et al.

(10) Patent No.: US 12,685,197 B2
(45) Date of Patent: Jul. 14, 2026

(54) CHIP SELECT WIRING FOR A DUAL DEVICE PACKAGE

(71) Applicant: Micron Technology, Inc., Boise, ID (US)

(72) Inventors: Scott R. Cyr, Boise, ID (US); David P. Gooch, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 18/520,405

(22) Filed: Nov. 27, 2023

(65) Prior Publication Data

US 2024/0178149 A1     May 30, 2024

Related U.S. Application Data

(60) Provisional application No. 63/429,037, filed on Nov. 30, 2022.

(51) Int. Cl.
*G11C 8/00*          (2006.01)
*G11C 11/408*       (2006.01)
(Continued)

(52) U.S. Cl.
CPC ........... *H10W 70/65* (2026.01); *G11C 11/408* (2013.01); *H10B 80/00* (2023.02);
(Continued)

(58) Field of Classification Search
CPC . H01L 23/5386; H01L 23/5383; H01L 25/18; H01L 24/32; H01L 24/33; H01L 24/45; H01L 24/48; H01L 24/73; H01L 2224/32145; H01L 2224/3225; H01L 2224/33181; H01L 2224/45124; H01L 2224/45139; H01L 2224/45144; H01L 2224/45147; H01L 2224/48091; H01L 2224/48145; H10B 80/00; G11C 11/408
(Continued)

(56) References Cited

U.S. PATENT DOCUMENTS 7,869,243 B2 *  1/2011  Bacha ...................... G11C 5/04
                                                    361/761
8,190,953 B2 *  5/2012  Chakravarthy .. G01R 31/31718
                                                    714/726
(Continued)

FOREIGN PATENT DOCUMENTS

JP        2009026359 A  *  2/2009

*Primary Examiner* — Viet Q Nguyen
(74) *Attorney, Agent, or Firm* — Holland & Hart LLP

(57)                ABSTRACT

Methods, systems, and devices for chip select wiring for a dual device package are described. A circuit board includes a plurality of layers, the plurality of layers including a first outer layer, a second inner layer, and a third outer layer. The circuit board also includes first and second chip select (CS) signal lines routed through the second inner layer of the circuit board, first and second memory devices coupled with the first outer layer and the third outer layer, respectively, a first via coupling the first CS signal line with a first upper memory die of the first memory device and a second lower memory die of the second memory device, and a second via coupling the second CS signal line with a second upper memory die of the second memory device and a first lower memory die of the first memory device.

20 Claims, 4 Drawing Sheets

(51) Int. Cl.

| | |
|---|---|
| *H10B 80/00* | (2023.01) |
| *H10W 70/60* | (2026.01) |
| *H10W 70/65* | (2026.01) |
| *H10W 70/685* | (2026.01) |
| *H10W 90/00* | (2026.01) |
| *H10W 72/00* | (2026.01) |
| *H10W 72/30* | (2026.01) |
| *H10W 72/50* | (2026.01) |

(52) U.S. Cl.
CPC ........ *H10W 70/611* (2026.01); *H10W 70/685* (2026.01); *H10W 90/00* (2026.01); *H10W 72/07354* (2026.01); *H10W 72/347* (2026.01); *H10W 72/552* (2026.01); *H10W 72/5522* (2026.01); *H10W 72/5524* (2026.01); *H10W 72/5525* (2026.01); *H10W 72/865* (2026.01); *H10W 72/884* (2026.01); *H10W 90/732* (2026.01); *H10W 90/734* (2026.01); *H10W 90/752* (2026.01); *H10W 90/754* (2026.01)

(58) Field of Classification Search
USPC ................................................. 365/230.03
See application file for complete search history.

(56) References Cited

U.S. PATENT DOCUMENTS

| | | | | |
|---|---|---|---|---|
| 8,553,469 | B2 * | 10/2013 | Berke | G11C 29/02 |
| | | | | 365/189.02 |
| 9,026,714 | B2 * | 5/2015 | Peterson | G06F 12/0623 |
| | | | | 711/E12.001 |
| 9,058,897 | B2 * | 6/2015 | Yu | G11C 14/0018 |
| 9,104,557 | B2 * | 8/2015 | Hinkle | G06F 12/0607 |
| 11,393,790 | B2 * | 7/2022 | Hiscock | G11C 29/816 |
| 11,699,471 | B2 * | 7/2023 | Galbi | G06F 13/287 |
| | | | | 365/233.1 |
| 11,798,604 | B2 * | 10/2023 | Schnell | G11C 7/1066 |
| 12,399,648 | B2 * | 8/2025 | Lu | G06F 3/0673 |
| 2012/0063246 | A1 * | 3/2012 | Suzuki | G11C 7/1093 |
| | | | | 365/193 |
| 2018/0081833 | A1 * | 3/2018 | Giovannini | G06F 13/1689 |
| 2024/0038295 | A1 * | 2/2024 | Um | G11C 11/4096 |

* cited by examiner

CHIP SELECT WIRING FOR A DUAL DEVICE PACKAGE

CROSS REFERENCE

The present application for patent claims the benefit of and priority to U.S. Provisional Application No. 63/429,037 by Cyr et al., entitled "CHIP SELECT WIRING FOR A DUAL DEVICE PACKAGE," filed Nov. 30, 2022, assigned to the assignee hereof, and is expressly incorporated by reference in its entirety herein.

FIELD OF TECHNOLOGY

The following relates to one or more systems for memory, including chip select wiring for a dual device package.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
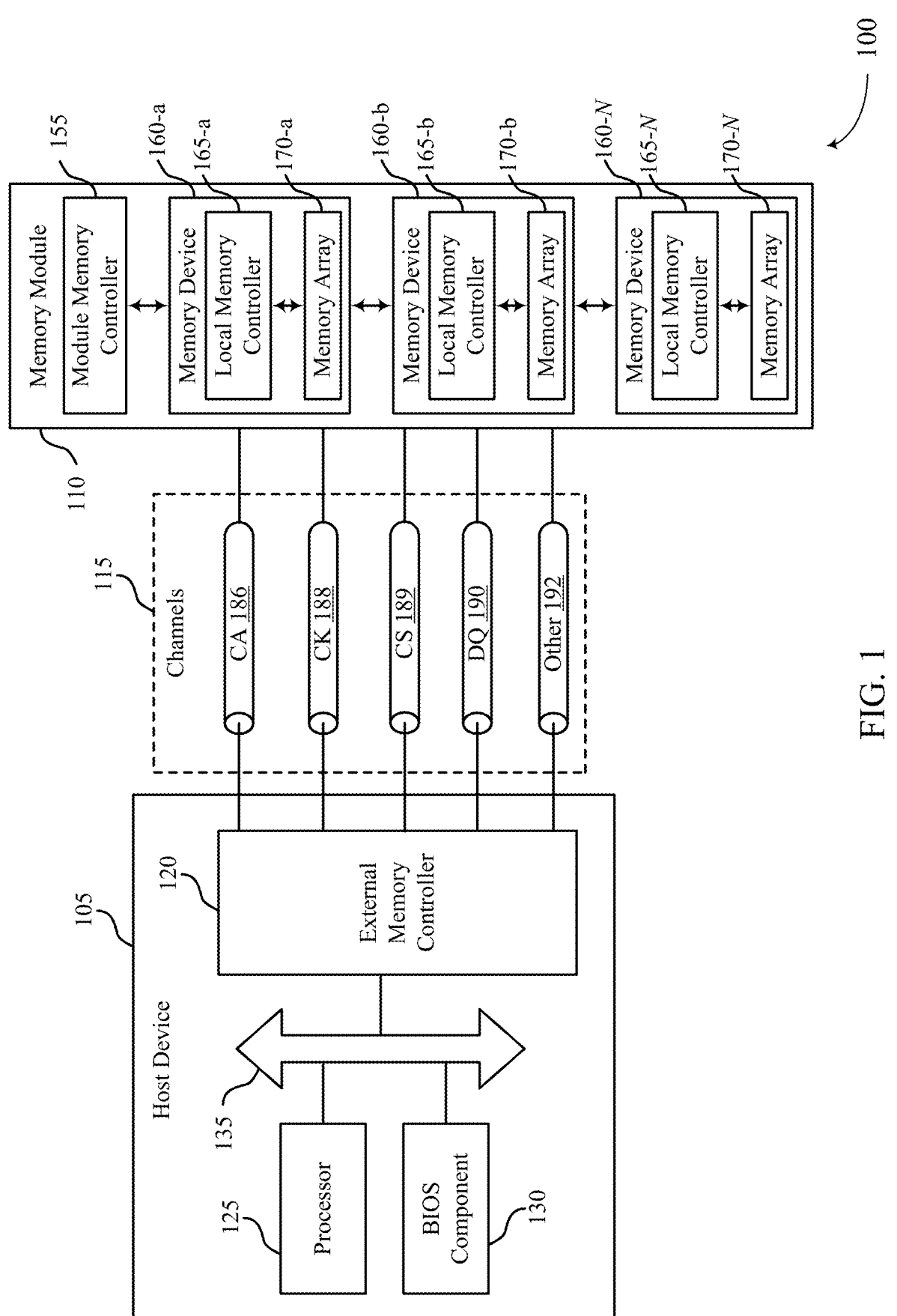
FIG. 1 illustrates an example of a system that supports chip select (CS) wiring for a dual device package (DDP) in accordance with examples as disclosed herein.

In some examples, a system may include a host system and a memory system. The memory system may include one or more controllers (e.g., a registered clock driver (RCD)) whose input is coupled with the host system (e.g., a controller of the host system) and whose outputs are coupled with one or more memory devices of the memory system. In some examples, the controller and the one or more memory devices may be coupled with one or more layers of a substrate (e.g., a printed circuit board (PCB)). For example, one or more first memory devices may be attached to a first outside layer of the substrate and one or more second memory devices may be attached to a second outside layer of the substrate opposite from the first outside layer. In such examples, each first memory device may be located back-to-back with a respective second memory device (e.g., a dual-sided PCB). Further, each memory device of the one or more memory devices may include a single memory die or multiple memory dies. For example, the one or more memory devices may be an example of a dual die package (DDP). In such a case, each memory device of the one or more memory devices may include an upper memory die and a lower memory die. In some examples, the one or more memory devices may include any quantity of memory dies (e.g., two, three, four, five, six, seven, eight memory dies).

In some examples, a purpose of a controller (e.g., the RCD) may be to distribute signals received from the host system to the one or more memory devices of the memory system. In order to distribute the signals, the controller may be coupled with memory devices via multiple signal lines (e.g., signal lines located at or routed through an inner layer of the substrate). As one example, the controller may be coupled with each of the upper memory dies via a first chip select (CS) signal and each of the lower memory dies via a second CS signal line. The CS signal lines may allow the host system to select either the upper memory dies or the lower memory dies of the memory system during an access operation (e.g., a read operation or a write operation). A location of a connection point between the upper memory die and the first CS signal line (e.g., a first CS pin) and a location of a connection point between the lower memory die and the second CS signal line (e.g., a second CS pin) may be set for every memory device of the memory system. For example, the location of the first CS pin may be on a left side of the DDP and the location of the second CS pin may be on a right side of the DDP. As such, the locations of the first CS pin and the second CS pin may be switched for memory devices that are located back-to-back with respect to one another. Because the location of the first CS pin and the second CS pin is swapped for back-to-back memory devices, coupling the first CS signal line to both the front and back first CS pins and coupling the second CS signal line to both the front and back second CS pins may result in long trace lengths (e.g., a trace from a via to a first CS pin on the front side and a trace from the via to a second CS pin on the back side) or a higher quantity of vias (e.g., a via near the first CS pin and a via near the second CS pin). Longer trace lengths may lead to lower signal quality as well as inefficient processing.

The techniques as described herein may present a different method of CS wiring that may support short trace lengths and improve CS signal integrity. In some examples, a host system may select a quantity of memory dies of the memory system (e.g., during an access operation). For example, using other methods, the host system may select the one or more lower memory dies or one or more upper memory dies of the memory devices of the memory system. However, it may be possible for the host system to select both lower memory dies and upper memory dies (e.g., as part of the access operation) as long as the quantity of memory dies selected stays the same and the host device is able to refer back to those same memory dies for future operations. With this in mind, a first CS signal line may be coupled with a first CS pin (e.g., an upper memory die) of a first memory device (e.g., a memory device located on a first outer layer of the substrate) and additionally, the first CS signal line may be coupled with a second CS pin (e.g., a lower memory die) of a second memory device (e.g., a memory device located on a second out layer of the substrate). Further, a second CS signal line may be coupled with a second CS pin (e.g., a lower memory die) of the first memory device and additionally, the second CS signal line may be coupled with a first CS pin (e.g., a upper memory die) of the second memory device.

Using such methods, a CS signal may not be coupled with upper memory dies or lower memory dies, but may be coupled with whichever memory die (e.g., either an upper memory die or a lower memory die) that results in a shorter trace length for back-to-back memory devices. As an example, a first via may extend through the layers of the substrate at the first signal line and a second via may extend through layers of the substrate at the second signal line. For the first memory device, a trace length from the first via to the first CS pin may be shorter than a trace length from first via to the second CS pin. Further, for the second memory device, the trace length from the first via to the second CS pin may be shorter than a trace length from first via to the first CS pin. Thus, using the methods as described herein may result in shorter trace length for CS signal lines when compared to other methods which may improve signal integrity of the CS signal.

Features of the disclosure are initially described in the context of systems as described with reference to FIG. 1. Features of the disclosure are described in the context of component diagrams, cross-section diagrams, top-down diagrams, and pin layout diagrams as described with reference to FIGS. 2, 3A, 3B, and 3C.

FIG. 1 illustrates an example of a system 100 that supports CS wiring for a DDP in accordance with examples as disclosed herein. The system 100 may include a host device 105, a memory module 110, and a plurality of channels 115 coupling the host device 105 with the memory module 110. The system 100 may include one or more memory modules 110, but aspects of the one or more memory modules 110 may be described in the context of a single memory device (e.g., memory module 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory module 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory module 110 may be an independent device or a component that is operable to provide physical memory addresses/space that may be used or referenced by the system 100. In some examples, a memory module 110 may be configurable to work with one or more different types of host devices. Signaling between the host device 105 and the memory module 110 may be operable to support one or more of: modulation schemes to modulate the signals, various pin configurations for communicating the signals, various form factors for physical packaging of the host device 105 and the memory module 110, clock signaling and synchronization between the host device 105 and the memory module 110, timing conventions, or other factors.

The memory module 110 may be operable to store data for the components of the host device 105. In some examples, the memory module 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, an input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory module 110 may include a module memory controller 155 and one or more memory devices 160 (e.g., memory chips) to support a desired capacity or a specified capacity for data storage. Each memory device 160 (e.g., memory device 160-a, memory device 160-b, memory device 160-N) may include a local memory controller 165 (e.g., local memory controller 165-a, local memory controller 165-b, local memory controller 165-N) and one or more memory arrays 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. In some examples, each memory device 160 may include one or more memory dies, where each memory die may include one or more memory arrays 170. A memory device 160 including two or more memory dies may be referred to as a multi-die memory or a multi-die package or a multi-chip memory or a multi-chip package. In some cases, a memory device 160 including two memory dies may be referred to as a dual-die package (DDP).

The module memory controller 155 may include circuits, logic, or components operable to control operation of the memory module 110. The module memory controller 155 may include the hardware, the firmware, or the instructions that enable the memory module 110 to perform various operations and may be operable to receive, transmit, or execute commands, data, or control information related to the components of the memory module 110. The module memory controller 155 may be operable to communicate with one or more of the external memory controller 120, the one or more memory devices 160, or the processor 125. In some examples, the module memory controller 155 may control operation of the memory module 110 described herein in conjunction with the local memory controller 165 of the memory device 160.

A local memory controller 165 (e.g., local to a memory device 160) may include circuits, logic, or components operable to control operation of the memory device 160. In some examples, a local memory controller 165 may be operable to communicate (e.g., receive or transmit data or commands or both) with the module memory controller 155. In some examples, a memory module 110 may not include a module memory controller 155, and a local memory controller 165 or the external memory controller 120 may perform various functions described herein. As such, a local memory controller 165 may be operable to communicate with the module memory controller 155, with other local memory controllers 165, or directly with the external memory controller 120, or the processor 125, or a combination thereof. Examples of components that may be included in the module memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the module memory controller 155 or local memory controller 165 or both.

The external memory controller 120 may be operable to enable communication of one or more of information, data, or commands between components of the system 100 or the host device 105 (e.g., the processor 125) and the memory module 110. The external memory controller 120 may convert or translate communications exchanged between the components of the host device 105 and the memory module 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory module 110, in some examples, the external memory controller 120, or its functions described herein, may be implemented by one or more components of a memory module 110 (e.g., a module memory controller 155, a local memory controller 165) or vice versa.

The components of the host device 105 may exchange information with the memory module 110 or memory devices 160 therein using one or more channels 115. The channels 115 may be operable to support communications between the external memory controller 120 and the memory module 110 or memory devices 160 therein. Each channel 115 may be examples of transmission mediums that carry information between the host device 105 and a memory device 160. In some cases, one or more of the channels 115 may be shared by multiple memory devices 160 of the memory module 110 (e.g., a channel 115 may be coupled with a corresponding pin at each of the memory devices 160). Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory module 110 or memory devices 160 therein. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock (CK) signal channels 188, one or more CS channels 189, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a CK signal). In DDR signaling, two modulation symbols (e.g., signal levels) of a signal may be registered for each clock cycle (e.g., on both a rising edge and a falling edge of a CK signal).

In some examples, CA channels 186 may be operable to communicate commands between the host device 105 and the memory module 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths). In some examples, the CA channel 186 may be coupled with one or more CA pins included in each memory device 160.

In some examples, CK signal channels 188 may be operable to communicate one or more CK signals between the host device 105 and the memory module 110. Each CK signal may be operable to oscillate between a high state and a low state, and may support coordination (e.g., in time) between actions of the host device 105 and the memory module 110. In some examples, the CK signal may be single ended. In some examples, the CK signal may provide a timing reference for command and addressing operations for the memory module 110, or other system-wide operations for the memory module 110. A CK signal therefore may be referred to as a control CK signal, a command CK signal, or a system CK signal. A system CK signal may be generated by a system clock, which may include one or more hardware components (e.g., oscillators, crystals, logic gates, transistors). In some examples, the CK signal channel 188 may be coupled with one or more CK pins included in each memory device 160.

In some examples, a CS channel 189 may be operable to communicate one or more CS signals between the host device 105 and the memory module 110. The purpose of a CS signal may be to enable or disable a memory device 160 or a memory die therein. For example, in a memory device 160 with a multi-die package (e.g., in a DDP), a CS signal may enable a die (e.g., a corresponding die) within the memory device 160. In some examples, the CS channel 189 may be coupled with one or more CS pins included in each memory device 160, where the CS pins may be operable to select between dies within a memory device 160 based on a CS signal. For example, the CS channel 189 may include one or more CS signal lines, where each CS signal line may be coupled with one or more CS pins of each memory device 160 for transmitting CS signals to the CS pins.

In some examples, data channels 190 may be operable to communicate one or more of data or control information between the host device 105 and the memory module 110. For example, the data channels 190 may communicate information (e.g., bi-directional) to be written to the memory module 110 or information read from the memory module 110.

The channels 115 may each include any quantity of signal paths (including a single signal path) coupled with any quantity of pins. In some examples, a channel 115 may include multiple individual signal paths. For example, a channel may be x4 (e.g., including four signal paths, and coupled with four corresponding pins at each of one or more memory devices 160), x8 (e.g., including eight signal paths, and coupled with eight corresponding pins at each of one or more memory devices 160), x16 (including sixteen signal paths, and coupled with sixteen corresponding pins at each of one or more memory devices 160), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory module 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), or others.

In some examples, a multi-symbol (or multi-level) modulation scheme may be used to modulate signals communicated between the host device 105 and the memory module 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, the memory module 110 may include a circuit board (e.g., a PCB board) that has multiple layers. Further, as shown in FIG. 1, the memory module 110 may include the module memory controller 155 and a set memory devices 160 that are each coupled with a respective layer of the circuit board. For example, a first subset of the memory devices 160 may be coupled with a top layer of the circuit board and a second subset of the memory devices 160 may be coupled with a bottom layer of the circuit board. In some examples, the first subset of memory devices 160 and the second subset of memory devices 160 may be arranged back-to-back with respect to one another. That is, each memory device 160 of the first subset may be located directly opposite of a respective memory device 160 of the second subset. Further, each memory device 160 may be an example of a DDP and may include a bottom memory die and an upper memory die.

In some examples, the host device 105 may perform an access operation on the memory module 110 and select a set of memory dies of the memory module 110. The set of memory dies may include one or more first memory dies (e.g., lower memory dies of the DDP) or one or more second memory dies (e.g., upper memory dies of the DDP). As such, a memory module 110 including back-to-back DDPs (e.g., memory devices 160) may include a first CS signal line coupled with pins corresponding to upper memory dies (e.g., first pins or CS0 pins) and a second CS signal line coupled with pins corresponding to lower memory dies (e.g., second pins or CS1 pins). For back-to-back memory devices 160, a location of the first pin and a location of a second pin for a second memory device 160 may be opposite (e.g., flipped) from a location of the first pin and a location of the second pin of a second memory device 160. As such, there may be two methods of routing the CS signal lines to the corresponding CS pins. In one example, a via may be placed next to each CS pin of the back-to-back memory devices 160 (e.g., 4 vias) such as to couple each memory die to the corresponding CS pin. However, introducing a large quantity of vias may increase manufacturing costs and device complexity. In another example, a first via (e.g., extending through the first CS signal line) may be placed near a first CS pin of one of the top or bottom memory device 160 and a second via (e.g., extending through the second CS signal line) may be placed near a second CS pin of the one of the top or bottom memory device 160. However, in such example, coupling the first via to the first CS pin of the top and bottom memory device and coupling the second via to the second CS pin of the top and bottom memory device may result in longer traces because of the flipped location of the first CS pin and the second CS pin for back-to-back memory devices 160. Longer trace lengths may lead to lower signal quality as well as inefficient processing.

The methods as described herein may support a CS wiring scheme that reduce trace lengths when compared to other CS wiring schemes. As described above, the memory module 110 may be an example of a circuit board that includes a module memory controller 155, one or more first memory devices 160, and one or more second memory devices 160, where the one or more first memory devices 160 are located on (e.g., coupled with) a top layer of the circuit board and the one or more second memory devices 160 are located on (e.g., coupled with) a bottom layer of the circuit board opposite to the top layer. Further, in some examples, the one or more first memory devices 160 and the one or more second memory device 160 may be examples of DDPs and may include an upper memory die and a lower memory die. Additionally, the module memory controller 155 may be coupled with a first CS signal line and a second CS signal line that are routed through an inner layer of the circuit board. Because the host device 105 may be unaware of the location or indexing of the memory dies, a CS signal line (e.g., a first CS signal line or a second CS signal) may be coupled with both a lower memory die and an upper memory die (e.g., as opposed to only an upper memory die or only a lower memory die) of two back-to-back memory devices 160 as long as the quantity of memory dies stays constant between CS signal lines and the relationship between the CS signal lines and the memory dies stays constant for future access operations.

As such, the memory module 110 may include a first via (e.g., extending through the layers of the circuit board) coupling the first CS signal line to an upper memory die of a first memory device 160 and a lower memory die of the second memory device 160. Additionally, the memory module 110 may include a second via coupling the second CS signal line to an upper memory die of the second memory device 160 and a lower memory die of the first memory device 160. Due to the inversion of the first CS pin and the second CS pin for back-to-back memory devices, a distance (e.g., a trace length) from the first via to the lower memory die of the second memory device 160 may be shorter than a distance (e.g., trace length) from the second via to the lower memory die of the second memory device 160. Further, a distance (e.g., trace length) from the second via to the upper memory device of the first memory device may be shorter than a distance (e.g., trace lengths) from the first via to the upper memory device of the first memory device. As such, the above CS signal wiring scheme may support shorter trace lengths which may improve CS signal quality and integrity.

Figure 2:
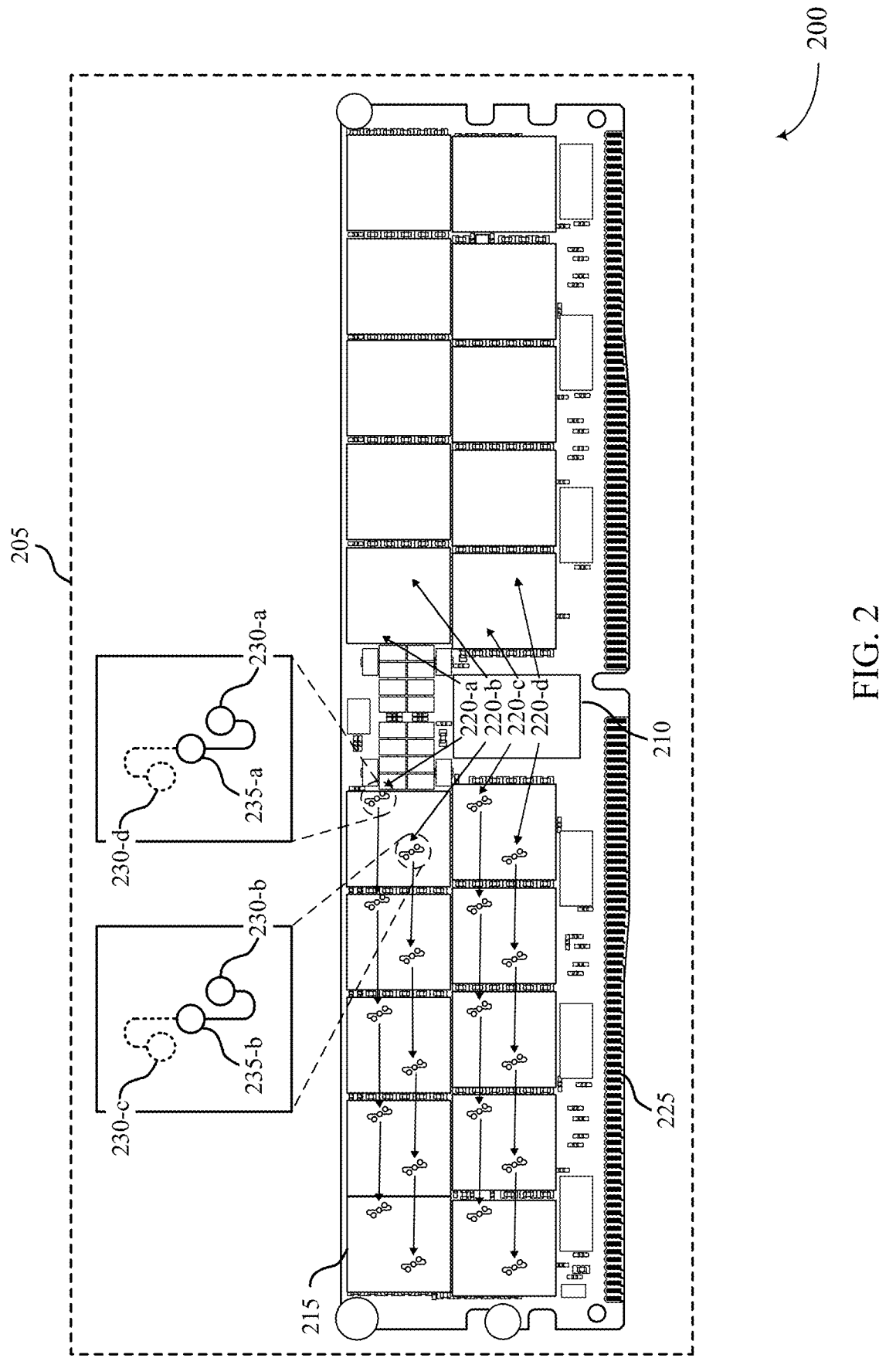
FIG. 2 illustrates an example of a component diagram that supports CS wiring for a DDP in accordance with examples as disclosed herein.

FIG. 2 illustrates an example of a component diagram 200 that supports CS wiring for a DDP in accordance with examples as disclosed herein. In some examples, the component diagram 200 may implement aspects of a system 100 as described with reference to FIG. 1. For example, the component diagram 200 may include a memory module 205 which may be an example of a memory module 110 as described with reference to FIG. 1. Further, the memory module 205 may also include a driver 210 which may be an example of a module memory controller 155 as described with reference to FIG. 1. Additionally, the driver 210 may be coupled with one or more memory devices 215 via one or more CS signal lines 220. The one or more memory devices 215 may be examples of the memory devices 160 as described with reference to FIG. 1 and the one or more CS signal lines 220 may be examples of CS signals lines corresponding to a CS channel 189 as described with reference to FIG. 1. In some examples, the memory devices 215 may otherwise be known as DRAM chips, the driver 210 may otherwise be known as an RCD, and the memory module 205 may otherwise be known as a dual in-line memory module (DIMM), a register DIMM (RDIMM), or a multiplexed RDIMM (MRDIMM). Further, in some examples, the memory module 205 may be a Compute a solder-down module, Express Link (CXL) module, or a server memory module. Additionally, the memory module 205 may include a data bus 225 that allows the memory module 205 to exchange data with host system (e.g., a motherboard) using a series of DQ pins (e.g., 64 DQ pins).

In some examples, the memory module 205 may communicate with a host device and may be coupled with the host device via the driver 210. The driver 210 may receive signals from the host device and redistribute the signals to components of the memory module 205 (e.g., the memory devices 215). In some examples, the driver 210 may couple with the memory module 205 via multiple pins and the multiple pins may allow the driver 210 to communicate with the components of the memory module 205. For example, the driver 210 may include a set of CS pins. A CS pin of the driver 210 may be coupled with a CS signal line that is routed (e.g., within an inner layer of the memory module) to a respective CS pin of the memory devices 215. In some examples, each memory device 215 may be an example of a DDP and may include a lower memory die and an upper memory die. Further, each memory die within a memory device 215 may have a corresponding CS pin 230. For example, a CS pin 230 for the lower memory die (e.g., CS1 pin) and a CS pin 230 for upper memory die (e.g., CS0 pin). As shown in FIG. 2, each channel of the memory module 205 may include five memory devices 215 on a top row and five memory device 215 on a bottom row. Further, the channel may include ten additional memory device 215 situated on the back-side of the memory module (e.g., five on the top row and five on the bottom row, not shown). It is understood that other channel configurations are possible. For example, a first channel of the memory module 205 may include the bottom row memory devices 215 (e.g., front and back) and a second channel of the memory module 205 may include top row memory devices 215 (e.g., front and back). A CS pin 230-a may correspond to an upper memory die of the front-facing memory devices 215 and CS pin 230-b may correspond to a lower memory die of the front-facing memory devices 215. Further, a CS pin 230-c may correspond to an upper memory die of the back-facing memory devices 215 and CS pin 230-d may correspond to a lower memory die of the back-facing memory devices 215. The pin locations for back-to-back memory devices may be switched with respect to the circuit board. For example, the CS pin 230 corresponding to the upper memory die (e.g., CS pin 230-a) may be located on the right side of the memory device and the CS pin 230 corresponding to the lower die (e.g., CS pin 230-b) may be located on the left side of the memory device for a front-facing memory device. Alternatively, the CS pin 230 corresponding to the upper memory die (e.g., CS pin 230-c) may be located on the left side of the memory device and the CS pin 230 corresponding to the lower die (e.g., CS pin 230-d) may be located on the right side of the memory device for a front-facing memory device. In FIG. 2, the location of the CS pins 230 are merely an example and other CS pin arrangements are possible.

In some examples, the memory module 205 may be an example of a multi-rank memory module. A multi-rank memory module may include multiple ranks of memory, where a rank of memory may be described as a set of memory dies that are coupled with a same CS signal line 220 and can therefore be accessed simultaneously. Further, each rank has a 64-bit data bus and as such, the number of memory dies included in a rank of memory may depend of a channel width size of the data bus for each individual memory die. The memory module 205 may be an example of a quad rank memory module. A quad rank memory module may include four CS signal lines 220. For example, as shown in FIG. 2, a CS signal line 220-a and a CS signal line 220-b may couple to the top row of memory devices 215 (e.g., front and back) and a CS signal line 220-c and a CS signal line 220-d may couple to the bottom row of memory devices 215 (front and back). More specifically, the CS signal line 220-a and CS signal line 220-c may couple to CS pins 230-a and CS pins 230-d and CS signal line 220-b and CS signal line 220-d may couple to CS pins 230-c and 230-b.

In some cases, the CS signal lines 220 may be coupled with the respective memory dies using a series of vias 235 (e.g., a through hole via, a micro via, a blind via, or a buried via). A via 235 may be described as a conducting hole that extends through layers of the circuit board and may be used to connect different layers of the circuit board together. In the example of FIG. 2, a via 235-a may be placed near each CS pin 230-d and CS pin 230-a (e.g., a via 235-a) along the CS signal line 220-a. The via 235-a may be couple the CS signal line 220-a to a CS pin 230-a using a first trace (e.g., trace that extends from the via 235-a to the CS pin 230-a) and couple the CS signal line 220-a to the CS pin 230-d using a second trace (e.g., trace that extends from the via 235-a to the CS pin 230-d). A trace may be described as a copper path that connects components of a circuit board together. Additionally, a via 235 may be placed near each CS pin 230-c and CS pin 230-c (e.g., vias 235-b) along the CS signal line 220-b. The via 235-b couple the CS signal line 220-b to a CS pin 230-b using a third trace (e.g., trace that extends from the via 235-b to the CS pin 230-b) and couple the CS signal line 220-b to a CS pin 230-d via a fourth trace (e.g., trace that extends from the via 235-b to the CS pin 230-d). A similar CS wiring scheme may be used to couple CS signal line 220-c and CS signal line 220-d to their respective memory dies. Although FIG. 2 illustrates a four rank memory module, it is understood that the CS wiring scheme described above can be applied to any rank device that include front and back facing memory devices (e.g., any dual-sided PCB). For example, the CS wiring as described herein may apply to single-rank and double-rank memory modules.

In some examples, the driver 210 may receive a command associated with a rank of memory dies from the host system. For example, the driver 210 may receive one or more access commands (e.g., a read command or a write command) from a host system. Using the one or more access commands, the driver 210 may determine a set of memory dies to access (e.g., a rank of memory dies to access) and generate a CS signal. The driver 210 may then transmit the generated CS signal to each memory die of the set via a CS signal line 220. As one example, the driver 210 may receive a read command and determine (e.g., based on the read) to select a rank of memory dies corresponding to the CS signal line 220-a. Upon determining to select the rank of memory cells, the driver may transmit (or propagate) a CS signal along CS signal line 220-a thereby activating or selecting the upper memory dies of the front-facing memory devices of the top row of memory devices and the lower memory dies of the back-facing memory devices of the top row of memory devices.

The techniques described herein may increase CS signal integrity by wiring CS signal lines to CS pins based on physical location as opposed to logical pin number. Wiring CS signal line to CS pins based on physical location may allow for shorter trace lengths. As opposed to longer trace lengths, shorter trace lengths may be less susceptible to or may minimize crosstalk, ringing, or interference and therefore, increase signal integrity.

Figure 3A:
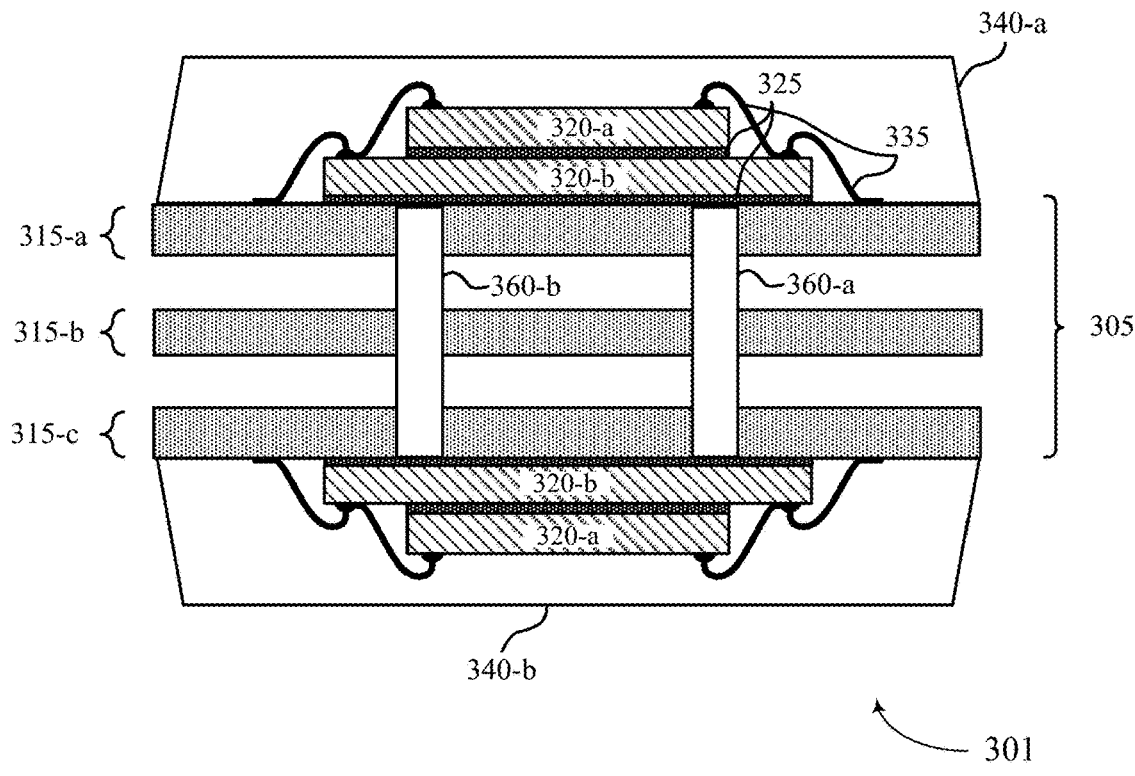
FIGS. 3A, 3B, and 3C illustrate examples of a cross-sectional component diagram, a top-down component diagram, and a pin layout diagram that support CS wiring for a DDP in accordance with examples as disclosed herein.
Figure 3B:
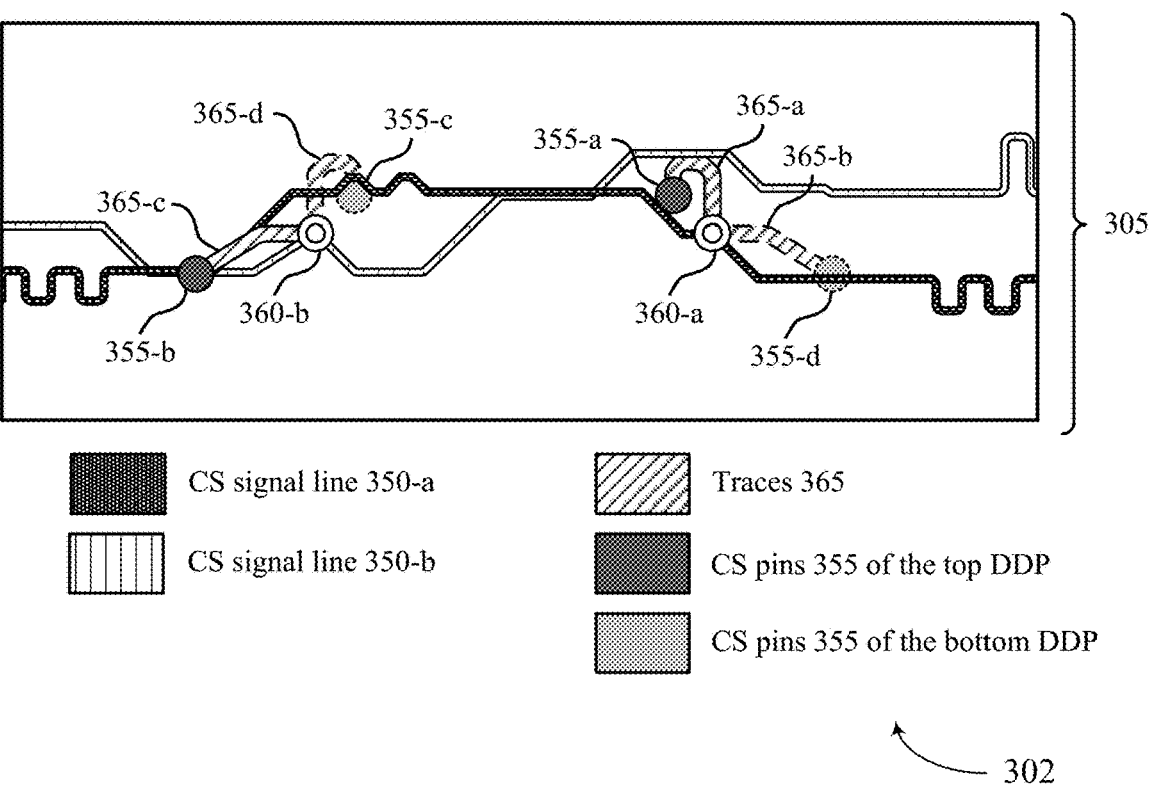
Figure 3C:
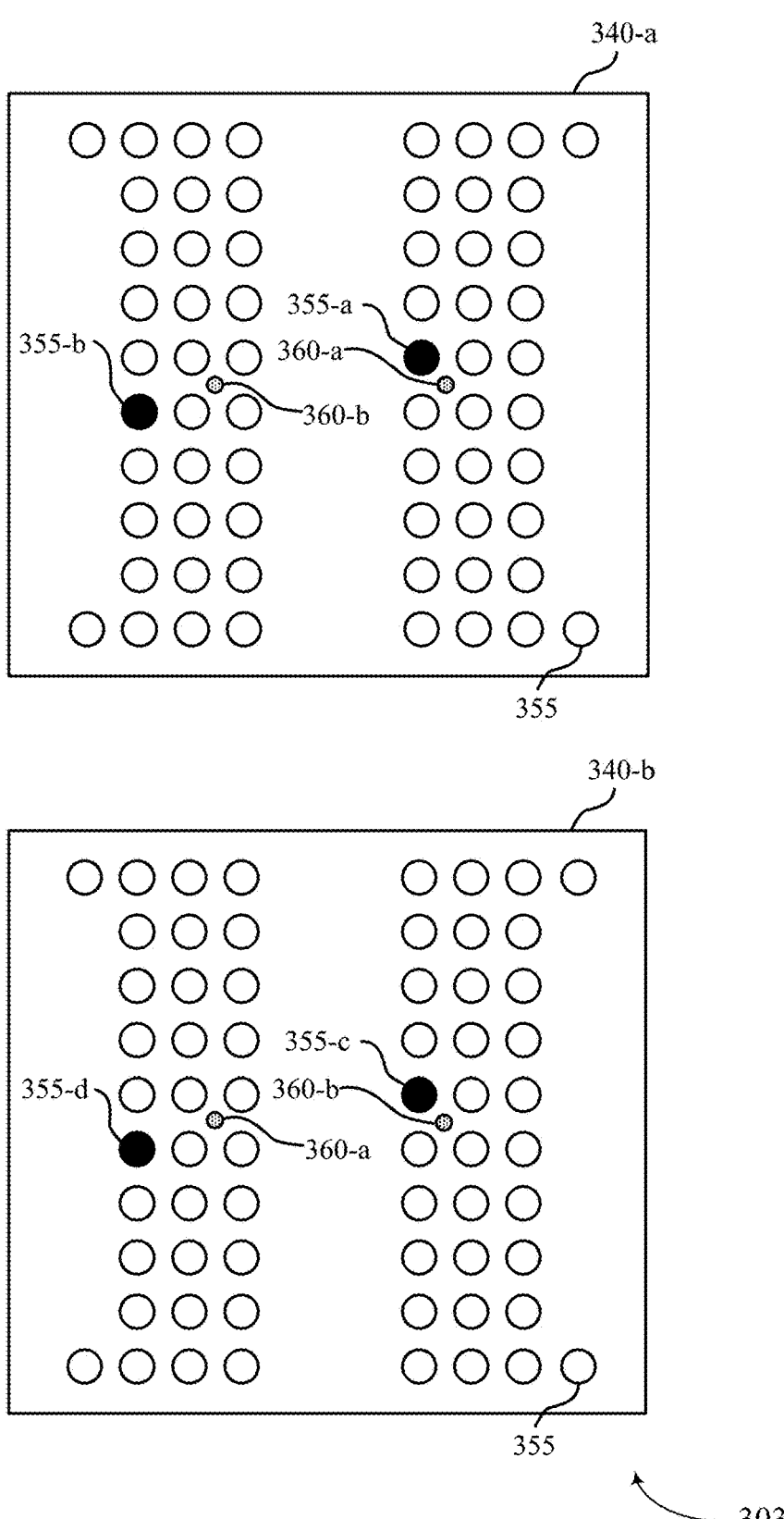

FIGS. 3A, 3B, and 3C illustrate examples of a cross-sectional component diagram 301, a top-down component diagram 302, and a pin layout diagram 303 that support CS wiring for a DDP in accordance with examples as disclosed herein. In some examples, the cross-sectional component diagram 301, the top-down component diagram 302, and the pin layout diagram 303 may implement aspects of a system 100 as described with reference to FIG. 1 and a component diagram 200 as described with reference to FIG. 2. For example, the cross-sectional component diagram 301 may represent a cross-section of a memory module which may be an example of a memory module 110 or a memory module 205 as described with reference to FIGS. 1 and 2. Further, the top-down component diagram 302 may represent a top-down view of the memory module which may be an example of the memory module 110 or the memory module 205 as described with reference to FIGS. 1 and 2. Similarly, the pin layout diagram 303 may represent a pin array corresponding to one or more memory devices of a memory module which may be an example of the memory module 110 or the memory module 205 as described with reference to FIGS. 1 and 2. Further, the pin layout diagram 303 may include a set of pins 355 and one or more pins 355 of the set of pins 355 may be examples of CS pins 230 as described with reference to FIG. 2.

As described with reference to FIG. 2, a memory module may include a substrate 305 and the substrate 305 may include multiple layers 315. For example, as shown in FIG. 3A, the substrate 305 may include a layer 315-*a*, a layer 315-*b*, and a layer 315-*c*. In some examples, the substrate may include more layers 315 than the layer 315-*a*, the layer 315-*b*, and the layer 315-*c* that are not illustrated in FIG. 3A. In some cases, the substrate 305 may be an example of a double-sided PBC. In such example, the layer 315-*a* and the layer 315-*c* may be examples conductive layers, where the layer 315-*a* may be the top-most layer of the substrate 305 and the layer 315-*c* may be bottom-most layer of the substrate 305. That is, both the layer 315-*a* and the layer 315-*c* may be the exposed surfaces of the substrate 305. Additionally, the layer 315-*b* may be an example of an internal conductive layer that is located between the layer 315-*a* and the layer 315-*c*. In some examples, one or more insulating layers may be situated between layer 315-*a* and layer 315-*b* or between layer 315-*b* and layer 315-*c*.

In some examples, FIG. 3A may illustrate a portion of the substrate 305. At the portion of the substrate 305, a DDP package 340-*a* may be coupled with the layer 315-*a* and a DDP package 340-*b* may be coupled with the layer 315-*c*. Each DDP package 340 may include a memory die 320-*a* (e.g., an upper memory die) and a memory die 320-*b* (a lower memory die). In some examples, the memory die 320-*a* and the memory die 320-*b* may be wire bonded. For example, one or more wire bonds 335 may couple together different combinations of the memory die 320-*a*, the memory die 320-*b*, and one of the layer 315-*a* or the layer 315-*b*. The material of the wire bonds 335 may include gold, aluminum, copper, silver, or any other conductive materials. Further, the memory die 320-*a* may attach to the memory die 320-*b* via a first attachment layer 325 and the memory die 320-*b* may attach to the layer 315-*a* and the layer 315-*c* via a second attachment layer 325. In some examples, the attachment layers 325 may be an example of a die attach layer or may include an array of solder bumps (e.g., in the case that the memory dies 320 are an example of flip chips).

Further, the DDP packages 340 may couple to the layer 315-*a* and the layer 315-*c* via a set of pins and the set of pins may include CS pins 355. The CS pin 355 for memory dies 320-*a* may be located on the right side of the DDP packages 240 and the CS pin 355 for the memory dies 320-*b* may be located on the left side of the DDP packages 240. The CS pins 355 may couple to CS signal lines running through the layer 315-*b* using one or more vias and one or more traces. In some examples, the solder bumps (or balls) of the attachment layer 325 may act as pins in a ball grid array.

FIG. 3B may illustrate a wiring configuration from CS signal lines 350 to CS pins 355 as described herein. Further, FIG. 3B may illustrate atop down view of the substrate 305 and the different components or structures at the different layers 315 of the substrate 305 that support the wiring configuration. As described with reference to FIG. 3A, the substrate 305 may include CS signal lines 350. For example, as shown in FIG. 3B, a CS signal line 350-*a* (e.g., a CS0 line) and a CS signal line 350-*b* (e.g., a CS1 line) may be routed through the layer 315-*b* of the substrate 305. The CS signal lines 350 may be coupled with one or more memory dies 320 of the memory module and outputs of a controller of the memory module. Further, an input of the controller may be coupled with a host system such that the controller may distribute CS signal to memory dies 320 selected by the host system.

At the layer 315-*a*, the DDP package 340-*a* may couple to the substrate 305 via a CS pin 355-*a* and a CS pin 355-*b*. The CS pin 355-*a* may correspond to the memory die 320-*a* of the DDP package 340-*a* and the CS pin 355-*b* may correspond to the memory die 320-*b* of the DDP package 340-*a*. Further, at the layer 315-*c*, the DDP package 340-*b* may couple to the substrate via the CS pin 355-*c* and the CS pin 355-*d*. The CS pin 355-*c* may correspond to the memory die 320-*a* of the DDP package 340-*b* and the CS pin 355-*d* may correspond to the memory die 320-*b* of the DDP package 340-*b*. In some examples, a location of the CS pin 355-*a* may be the same as a location of the CS pin 355-*c* (e.g., when looking at the DDP packages 340 from a same perspective). Similarly, a location of the CS pin 355-*b* may be the same as a location of the CS pin 355-*d*. However, when the DDP packages 340 are situated back-to-back a distance between the CS pin 355-*a* and the CS pin 355-*c* may be greater than a distance between than a distance between the CS pin 355-*a* and the CS pin 355-*d*. Similarly, when the DDP packages are situated back-to-back a distance between the CS pin 355-*b* and the CS pin 355-*d* may be greater than a distance between the CS pin 355-*b* and the CS pin 355-*c*. This may be a result of back-to-back DDP packages 340 having inverse pin configurations with respect to one another.

In some examples, the substrate 305 may include one or more vias 360 that may be used to couple the CS pins 355 to respective CS signal lines 350. For example, the substrate 305 may include a via 360-*a* and a via 360-*b*. In some cases, the vias 360 may extend through each layer 315 of the substrate 305 (e.g., through-hole vias). In another example, the vias 360 may represent vias which do not extend through each layer 315 of the circuit board, and which may extend through a portion of the substrate 305 (e.g., micro vias, blind vias, or buried vias). In the example of FIG. 3B, the via 360-*a* may couple the CS signal line 350-*a* to the memory die 320-*a* of the DDP package 340-*a* and the memory die 320-*b* of the DDP package 340-*b*. Similarly, the via 360-*b* may couple the CS signal line 350-*b* with the memory die 320-*a* of the DDP package 340-*b* and the memory die 320-*b* of the DDP package 340-*a*.

Further, the substrate 305 may include one or more traces 365 at the layer 315-*a* and the layer 315-*c* to couple the pins 355 to the vias 360. For example, the substrate 305 may include a trace 365-*a* at the layer 315-*a* coupling the via 360-*a* with the CS pin 355-*a* and a trace 365-*b* at the layer 315-*c* coupling the via 360-*a* with the CS pin 355-*d*. The substrate 305 may similarly include a trace 365-*c* at the layer 315-*a* coupling the via 360-*b* with the CS pin 355-*b* and a trace 365-*d* at the layer 315-*c* coupling the via 360-*b* with the CS pin 355-*c*. In some examples, the traces 365 may include conductive material (e.g., copper).

In some examples, the controller may perform an access operation on the memory module. In such examples, the controller may receive a first command (e.g., from the host system) and identify a rank of memory dies to access using the first command (e.g., information included in the first command). As one example, the controller may identify a rank of memory cells associated with the CS signal line 350-*a*. Upon identifying the rank of memory cells, the controller may route a CS signal along the CS signal line 350-*a* thus activating the memory die 320-*a* of the DDP package 340-*a* and the memory die 320-*b* of the DDP package 340-*b*. Further, the controller may receive a second command and identify a second rank of memory dies to access using the second command. As one example, the controller may identify a second rank of memory dies associated with the CS signal line 350-*b*. In such examples, the controller may route a CS signal along the CS signal line 350-*b* thus activating the memory die 320-*b* of the DDP package 340-*a* and the memory die 320-*a* of the DDP package 340-*b*. In some examples, the first command and the second command may be examples of an access command (e.g., a read command or a write commands). FIGS. 3A and a 3B illustrate one DDP package 340-*a* and one DDP package 340-*b*. However, it is understood there may be multiple DDP packages 340-*a* and DDP packages 340-*b*. For example, the layer 315-*a* may include a first row of two or more DDP packages 340-*a* and the layer 315-*c* may include a second row of DDP packages 340-*b*. Similar CS signal line wiring configurations can be applied to other DDP packages 340 of a same row.

FIG. 3C may include a top-down view of the DDP package 340-*a*. As described in FIG. 3A, the DDP package 340-*a* may be located on a top exposed surface of the substrate 305. As such, the top-down view of the DDP package 340-*a* illustrates an array of pins 355 just below the DDP package 340-*a* looking down at the top exposed surface. Further, FIG. 3C may include a top-down view of the DDP package 340-*b*. As described with reference to FIG. 3A, the DDP package 340-*b* may be located on a bottom exposed surface of the substrate 305. As such, the top-down view of the DDP package 340-*b* illustrates an array of pins 355 just below the DDP package 340-*b* looking down at the bottom exposed surface. The DDP package 340-*a* may include the CS pin 355-*a* and the CS pin 355-*b* and the DDP package 340-*b* may include the CS pin 355-*c* and the CS pin 355-*d*. The CS pin 355-*a* may correspond to the memory die 320-*a* of the DDP package 340-*a* and the CS pin 355-*b* may correspond to the memory de 320-*b* of the DDP package 340-*a*. Similarly, the CS pin 355-*c* may correspond to the memory die 320-*a* of the DDP package 340-*b* and the CS pin 355-*d* may correspond to the memory de 320-*b* of the DDP package 340-*b*.

As shown in FIG. 3C, a location of the CS pin 355-*a* in the array of pins 355 of the DDP package 340-*a* may be the same as a location of the CS pin 355-*c* in the array of pins 355 of the DDP package 340-*b*. Further, a location of the CS pin 355-*d* in the array of pins 355 of the DDP package 340-*a* may be the same as a location of the CS pin 355-*d* in the array of pins 355 of the DDP package 340-*b*. The array of pins 355 may allow the DDP packages 340 to attach to an exposed surface. In some examples, the array of pins 355 may be an example of an attachment layer 325 as described with reference to FIG. 3A. As described in FIG. 3B, a via 360-*a* extending through the layers of the substrate 305 may be placed along a CS signal line 350-*a* and a via 360-*b* extending through the layers of the substrate 305 may be placed along the CS signal line 350-*b*. Because the DDP package 340-*a* is located on an opposite surface of the DDP package 340-*b*, a location of the via 360-*a* and a location of the via 360-*b* may be swapped for the top-down view of the DDP package 340-*a* and the top-down view of the DDP package 340-*b*. To couple a via 360 to a corresponding CS pin 355, a trace (e.g., traces 365) may be formed between the via 360 and the corresponding CS pin 355.

In one example, traces may be formed between the via 360-*a* and the top memory dies 320 of the two DDP packages 340 (e.g., the CS pin 355-*a* and the CS pin 355-*c*) and similarly traces may be formed between the via 360-*b* and the bottom memory dies 320 of the two DDP packages

340 (e.g., the CS pin 355-*b* and the CS pin 355-*d*). However, because the location of the vias 360 are swapped, the trace from the CS pin 355-*c* and the via 360-*a* and the trace from the CS pin 355-*d* and the via 360-*b* may be relatively long. Thus, as described herein, traces may be formed between the via 360-*a* and the CS pin 355-*a* and the CS pin 355-*d* and traces may be formed between the via 360-*b* and the CS pin 355-*b* and the CS pin 355-*c*. The trace length from the CS pin 355-*c* to the via 360-*b* may be shorter than the trace length from the CS pin 355-*c* to the via 360-*a* and the trace length from the CS pin 355-*d* to the via 360-*a* may be shorter than the trace length from the CS pin 355-*d* to the via 360-*b*.

The techniques described herein may present more efficient methods for accessing memory dies 320. The distance between CS pins 355 and vias 360 may be shorter than other configurations which may allow for shorter traces 365. Shorter traces 365 may allow for more efficient processing, as well as additional space in the memory module for other components.

An apparatus is described. The following provides an overview of aspects of the apparatus as described herein:

Aspect 1: An apparatus, including: a circuit board including a plurality of layers, the plurality of layers including at least a first outer layer (e.g., layer 315-*a*), a second inner layer (e.g., layer 315-*b*), and a third outer layer (e.g., layer 315-*c*), where the second inner layer is between the first outer layer and the third outer layer; a first CS signal line (e.g., CS signal line 350-*a*) routed through the second inner layer of the circuit board; a second CS signal line (e.g., CS signal line 350-*b*) routed through the second inner layer of the circuit board; a first memory device (e.g., DDP package 340-*a*) coupled with the first outer layer of the circuit board, where the first memory device includes a first upper memory die (e.g., memory die 320-*a*) and a first lower memory die (e.g., memory die 320-*b*); a second memory device (e.g., DDP package 340-*b*) coupled with the third outer layer of the circuit board, where the second memory device includes a second upper memory die (e.g., memory die 320-*a*) and a second lower memory die (e.g., memory die 320-*b*); a first via (e.g., via 360-*a*) extending through the plurality of layers, where the first via couples the first CS signal line with the first upper memory die of the first memory device and the second lower memory die of the second memory device; and a second via (e.g., via 360-*b*) extending through the plurality of layers, where the second via couples the second CS signal line with the second upper memory die of the second memory device and the first lower memory die of the first memory device.

Aspect 2: The apparatus of aspect 1, where the first memory device is coupled with the first outer layer via a first plurality of pins, the first plurality of pins including a first CS pin corresponding to the first upper memory die and a second CS pin corresponding to the first lower memory die, and the second memory device is coupled with the third outer layer via a second plurality of pins, the second plurality of pins including a third CS pin corresponding to the second upper memory die and a fourth CS pin corresponding to the second lower memory die.

Aspect 3: The apparatus of aspect 2, further including: a first trace coupling the first via with the first CS pin; a second trace coupling the first via with the fourth CS pin; a third trace coupling the second via with the second CS pin; and a fourth trace coupling the second via with the third CS pin.

Aspect 4: The apparatus of any of aspects 2 through 3, where a location of the first CS pin within the first plurality of pins is the same as a location of the third CS pin within the second plurality of pins, and a location of the second CS pin within the first plurality of pins is the same as the fourth CS pin within the second plurality of pins.

Aspect 5: The apparatus of any of aspects 2 through 4, where a first distance between the first via and the fourth CS pin is shorter than a second distance between the first via and the third CS pin, and a third distance between the second via and the third CS pin is shorter than a fourth distance between the second via the fourth CS pin.

Aspect 6: The apparatus of any of aspects 1 through 5, further including: a controller, where an input of the controller is coupled with a host device, a first output of the controller is coupled with the first CS signal line, and a second output of the controller is coupled with the second CS signal line.

Aspect 7: The apparatus of aspect 6, where the controller includes an RCD.

Aspect 8: The apparatus of any of aspects 1 through 7, where the first outer layer and the third outer layer are exposed outer surfaces of the circuit board.

Aspect 9: The apparatus of any of aspects 1 through 8, where the first memory device and the second memory device are located back-to-back with respect to one another.

An apparatus is described. The following provides an overview of aspects of the apparatus as described herein:

Aspect 10: An apparatus, including: a substrate; a plurality of CS signal lines located within the substrate, the plurality of CS signal lines including at least a first CS signal line and a second CS signal line; a plurality of first memory devices, each first memory device of the plurality of first memory devices coupled with a first outside surface of the substrate, each first memory device including a first lower memory die coupled with the second CS signal line and a first upper memory die coupled with the first CS signal line; a plurality of second memory devices, each second memory device of the plurality of second memory devices coupled with a second outside surface of the substrate, each second memory device including a second lower memory die coupled with the first CS signal line and a second upper memory die coupled with the second CS signal line; and a controller coupled with the plurality of CS signal lines and operable to: transmit a first CS signal to each of the first lower memory dies and the second upper memory dies via the first CS signal line based on identifying a first rank of memory dies to access.

Aspect 11: The apparatus of aspect 10, where the controller is further operable to: identify the first rank of memory dies to access based on receiving a first command; identify a second rank of memory dies to access based on receiving a second command; and transmit a second CS signal to each of the first upper memory dies and the second lower memory dies via the second CS signal line based on identifying the second rank of the memory dies to access.

Aspect 12: The apparatus of any of aspects 10 through 11, where the controller is further configured to: receive a first command associated with the first rank.

Aspect 13: The apparatus of aspect 12, where the first command includes a read command or a write command.

Aspect 14: The apparatus of any of aspects 10 through 13, where the apparatus further includes: a plurality of first vias extending through the substrate, where each first via of the plurality of first vias couples a respective first lower memory die and a respective second upper memory die to the first CS signal line; and a plurality of second vias extending through the substrate, where each second via of the plurality of second vias couples a respective first upper memory die and a respective second lower memory die to the second CS signal line.

Aspect 15: The apparatus of aspect 14, further including: a plurality of first traces, where each first trace couples a first CS pin of a respective first lower memory die to a respective first via of the plurality of first vias; a plurality of second traces, where each second trace couples a second CS pin of a respective second upper memory die to the respective first via of the plurality of first vias; a plurality of third traces, where each third trace couples a third CS pin of a respective second lower memory die to a respective second via of the plurality of second vias; and a plurality of fourth traces, where each fourth trace couples a fourth CS pin of a respective first upper memory die to the respective second via of the plurality of second vias.

Aspect 16: The apparatus of any of aspects 10 through 15, where the plurality of CS signal lines further includes a third CS signal line and a fourth CS signal line, the apparatus further including: a plurality of third memory devices, each third memory device of the plurality of third memory devices coupled with the first outside surface of the substrate and including a third lower memory die and a third upper memory die; and a plurality of fourth memory devices, each fourth memory device of the plurality of fourth memory devices coupled with the second outside surface of the substrate and including a fourth lower memory die and a fourth upper memory die.

Aspect 17: The apparatus of any of aspects 10 through 16, where the plurality of first memory devices and the plurality of second memory devices are aligned back-to-back such that each first memory device of the plurality of first memory devices is aligned back-to-back with a respective second memory device of the plurality of second memory devices.

Aspect 18: The apparatus of any of aspects 10 through 17, where the controller includes an RCD.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a circuit board comprising a plurality of layers, the plurality of layers comprising at least a first outer layer, a second inner layer, and a third outer layer, wherein the second inner layer is between the first outer layer and the third outer layer;
   a first chip select signal line routed through the second inner layer of the circuit board;
   a second chip select signal line routed through the second inner layer of the circuit board;
   a first memory device coupled with the first outer layer of the circuit board, wherein the first memory device comprises a first upper memory die and a first lower memory die;
   a second memory device coupled with the third outer layer of the circuit board, wherein the second memory device comprises a second upper memory die and a second lower memory die;
   a first via extending through the plurality of layers, wherein the first via couples the first chip select signal line with the first upper memory die of the first memory device and the second lower memory die of the second memory device; and
   a second via extending through the plurality of layers, wherein the second via couples the second chip select signal line with the second upper memory die of the second memory device and the first lower memory die of the first memory device.

2. The apparatus of claim 1, wherein the first memory device is coupled with the first outer layer via a first plurality of pins, the first plurality of pins comprising a first chip select pin corresponding to the first upper memory die and a second chip select pin corresponding to the first lower memory die, and wherein the second memory device is coupled with the third outer layer via a second plurality of pins, the second plurality of pins comprising a third chip select pin corresponding to the second upper memory die and a fourth chip select pin corresponding to the second lower memory die.

3. The apparatus of claim 2, further comprising:
   a first trace coupling the first via with the first chip select pin;
   a second trace coupling the first via with the fourth chip select pin;
   a third trace coupling the second via with the second chip select pin; and
   a fourth trace coupling the second via with the third chip select pin.

4. The apparatus of claim 2, wherein a location of the first chip select pin within the first plurality of pins is the same as a location of the third chip select pin within the second plurality of pins, and wherein a location of the second chip select pin within the first plurality of pins is the same as the fourth chip select pin within the second plurality of pins.

5. The apparatus of claim 2, wherein a first distance between the first via and the fourth chip select pin is shorter than a second distance between the first via and the third chip select pin, and wherein a third distance between the second via and the third chip select pin is shorter than a fourth distance between the second via and the fourth chip select pin.

6. The apparatus of claim 1, further comprising:
   a controller, wherein an input of the controller is coupled with a host device, a first output of the controller is coupled with the first chip select signal line, and a second output of the controller is coupled with the second chip select signal line.

7. The apparatus of claim 6, wherein the controller comprises a registered clock driver.

8. The apparatus of claim 1, wherein the first outer layer and the third outer layer are exposed outer surfaces of the circuit board.

9. The apparatus of claim 1, wherein the first memory device and the second memory device are located back-to-back with respect to one another.

10. An apparatus, comprising:
    a substrate;
    a plurality of chip select signal lines located within the substrate, the plurality of chip select signal lines comprising at least a first chip select signal line and a second chip select signal line;
    a plurality of first memory devices, each first memory device of the plurality of first memory devices coupled with a first outside surface of the substrate, each first memory device comprising a first lower memory die coupled with the second chip select signal line and a first upper memory die coupled with the first chip select signal line;
    a plurality of second memory devices, each second memory device of the plurality of second memory devices coupled with a second outside surface of the substrate, each second memory device comprising a second lower memory die coupled with the first chip select signal line and a second upper memory die coupled with the second chip select signal line; and
    a controller coupled with the plurality of chip select signal lines and operable to:
        transmit a first chip select signal to each of the first upper memory dies and the second lower memory dies via the first chip select signal line based on identifying a first rank of memory dies to access.

11. The apparatus of claim 10, wherein the controller is further operable to:
    identify the first rank of memory dies to access based on receiving a first command;
    identify a second rank of memory dies to access based on receiving a second command; and
    transmit a second chip select signal to each of the first lower memory dies and the second upper memory dies via the second chip select signal line based on identifying the second rank of the memory dies to access.

12. The apparatus of claim 10, wherein the controller is further configured to:
    receive a first command associated with the first rank.

13. The apparatus of claim 12, wherein the first command comprises a read command or a write command.

14. The apparatus of claim 10, wherein the apparatus further comprises:
    a plurality of first vias extending through the substrate, wherein each first via of the plurality of first vias couples a respective first upper memory die and a respective second lower memory die to the first chip select signal line; and
    a plurality of second vias extending through the substrate, wherein each second via of the plurality of second vias couples a respective first lower memory die and a respective second upper memory die to the second chip select signal line.

15. The apparatus of claim 14, further comprising:
    a plurality of first traces, wherein each first trace couples a first chip select pin of a respective first upper memory die to a respective first via of the plurality of first vias;
    a plurality of second traces, wherein each second trace couples a second chip select pin of a respective second lower memory die to the respective first via of the plurality of first vias;
    a plurality of third traces, wherein each third trace couples a third chip select pin of a respective second upper memory die to a respective second via of the plurality of second vias; and
    a plurality of fourth traces, wherein each fourth trace couples a fourth chip select pin of a respective first lower memory die to the respective second via of the plurality of second vias.

16. The apparatus of claim 10, wherein the plurality of chip select signal lines further comprises a third chip select signal line and a fourth chip select signal line, the apparatus further comprising:
    a plurality of third memory devices, each third memory device of the plurality of third memory devices coupled with the first outside surface of the substrate and comprising a third lower memory die and a third upper memory die; and
    a plurality of fourth memory devices, each fourth memory device of the plurality of fourth memory devices coupled with the second outside surface of the substrate and comprising a fourth lower memory die and a fourth upper memory die.

17. The apparatus of claim 10, wherein the plurality of first memory devices and the plurality of second memory devices are aligned back-to-back such that each first memory device of the plurality of first memory devices is aligned back-to-back with a respective second memory device of the plurality of second memory devices.

18. A non-transitory computer-readable medium storing code for an apparatus, the code comprising instructions executable by a processor to:
    identify a first rank of memory dies to access based on receiving a first command;
    generate a first chip select signal based on identifying the first rank of memory dies; and
    transmit the first chip select signal to an upper memory die of a first memory device and a lower memory die of a second memory device via a first chip select signal line that is coupled with the upper memory die of the first memory device and the lower memory die of the second memory device based on generating the first chip select signal.

19. The non-transitory computer-readable medium of claim 18, wherein the instructions are further executable by the processor to:
    receive the first command associated with the first rank of memory dies.

20. The non-transitory computer-readable medium of claim 18, wherein the first command comprises a read command or a write command.

* * * * *